United States Patent [19]

Yamanouchi et al.

[11] Patent Number: 4,654,826

[45] Date of Patent: Mar. 31, 1987

[54] SINGLE DEVICE TRANSFER STATIC LATCH

[75] Inventors: Roy K. Yamanouchi; Robert W. Williams, both of San Jose, Calif.

[73] Assignee: National Semiconductor Corporation, Santa Clara, Calif.

[21] Appl. No.: 642,305

[22] Filed: Aug. 20, 1984

[51] Int. Cl.[4] .............................................. G11C 7/00
[52] U.S. Cl. ..................................... 365/189; 365/154
[58] Field of Search ....................... 365/189, 154, 190; 307/567, 238.1

[56] References Cited

U.S. PATENT DOCUMENTS

| | | | |
|---|---|---|---|
| 4,445,203 | 4/1984 | Iwahashi | 365/189 |
| 4,546,455 | 10/1985 | Iwahashi et al. | 365/189 |

Primary Examiner—James W. Moffitt
Attorney, Agent, or Firm—Gail W. Woodward

[57] ABSTRACT

Each cell of a static latch implemented in MOS transistor circuitry includes an MOS transistor configured to operate a depletion mode and operably coupled to communicate an output node of the cell to an input node of the cell in absence of a control signal, to effect the latching operation. Presence of the control signal allows data to be efficiently written to the cell by enabling a transfer gate to establish a communication path for the data to the input node of the cell, while at the same time disabling the MOS transistor to terminate communication of the output node of the cell to its input node during the write operation.

5 Claims, 2 Drawing Figures

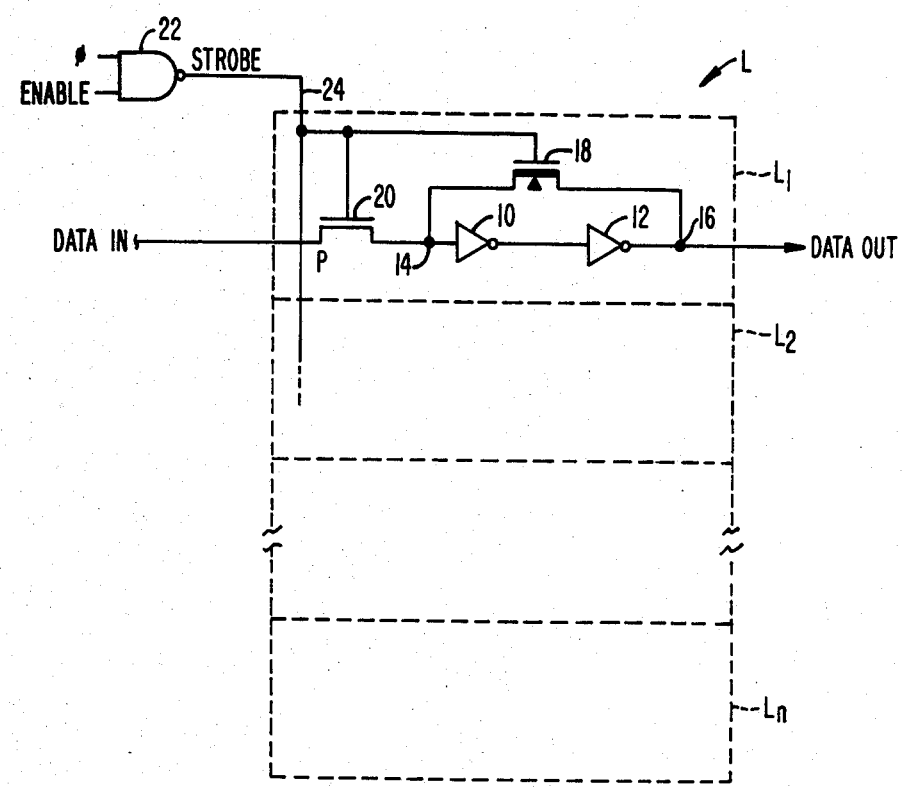
FIG._1.
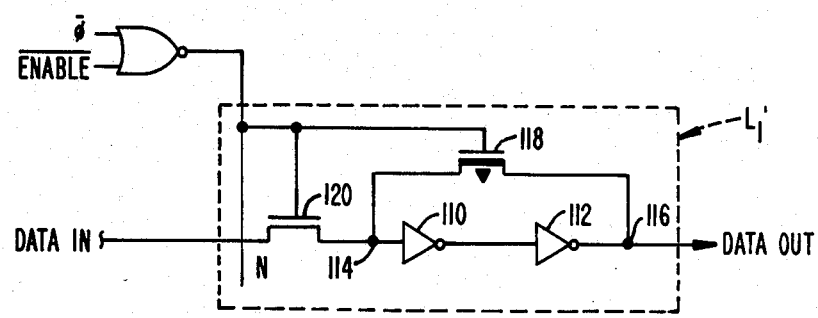
FIG._2.

SINGLE DEVICE TRANSFER STATIC LATCH

The present invention is directed generally to a digital storage element for use in microprocessor design. More particularly, the invention is directed to a static latch design for implementation as part of an integrated circuit, and providing improved operational reliability and a reduction of semiconductor area used to form the latch than heretofore realized.

BACKGROUND OF THE INVENTION

Microprocessor design often incorporates, integrated on a single semiconductor chip in one form or another, one or more storage units to be used for temporarily storing digital information. One type of storage commonly used is a dynamic random access memory (RAM). For various reasons which will be recognized by those skilled in this art, RAM type memory brings with it certain disadvantages which, when the microprocessor and accompanying memory is to be implemented in integrated circuit form, make it desirable to look for other types of temporary storage. For example, dynamic RAM often will require more semiconductor area for implementation.

Another type of temporary storage element for microprocessor use is a static latch. Latches are used in favor of RAM storage in isolated, distributed locations throughout the architecture of the microprocessor or such as, for example, as temporary data storage at inputs or outputs of various elements. One implementation of a latch uses a pair of inverter circuits and a feedback path coupling the output to the input for each individual "cell" (i.e., single-bit storage), thereby "latching" the information applied to the input. This type of latch, commonly known as a "static latch," is often found in complementary metal-oxide-silicon (CMOS) microprocessor implementation, and includes a transfer gate, operable in response to a strobe signal, to transfer data from a data line to the input stage for latching. The transfer gate may be formed from an N-channel MOS transistor and a P-channel MOS transistor coupled in parallel (i.e., their respective source and drain leads connected together), the respective gate leads of each transistor being adapted to receive the strobe signal and its complement. One disadvantage to this type of transfer gate is that signal line pairs must conduct the strobe signal and its complement to each transfer gate, resulting in a significant semiconductor-area penalty in the integrated circuit layout of each static latch used.

A partial solution is to eliminate one of the MOS transistors (usually the P-channel transistor). Thereby, the remaining transistor used to implement the transfer gate needs only the strobe signal or its complement, not both, to operate. Thus, deletion of one strobe line is accomplished, accompanied by a decrease in semiconductor area required for formation of the latch. Unfortunately, two problems occur in this implementation: First, where a logic "1" is stored in the latch cell and a logic "0" is being written, the feedback device (usually a single MOS transistor connected to operate in a depletion mode) can be placed in a gate overdrive condition, resulting in the transfer gate having to be excessively large enough to handle the current created by this situation. This, in turn, requires more semiconductor area to form the transistor of the transfer gate.

In the alternative case, involving a logic "0" stored and a logic "1" being written, the transfer gate transistor must supply enough current to both charge the input node and to supply current to the feedback device. Often there can be a problem attempting to pull the voltage up to reach the trip point of the latch cell input during the time period allotted by the strobe signal. The transfer gate transistor is operating, in this circumstance, in a voltage follower mode in which the current therethrough decreases as a square law function when the source lead of the transfer gate transistor is pulled to a "1" voltage level. The situation is ascerbated by the fact that the feedback transistor forming the feedback path of the latch is on. Thus, as the input voltage to the latch rises, the current necessary to charge the capacitance of the input node of the latch decreases considerably.

It can be seen, therefore, that while the use of static latches in semiconductor design have advantages over use of RAM elements, such use can affect microprocessor design insofar as the amount of semiconductor area needed to implement the latch circuits vis-a-vis the remainder of the microprocessor, a major concern of any integrated semiconductor circuit design.

SUMMARY OF THE INVENTION

The present invention is a static latch configured to have the feedback device operable from the same strobe signal that enables the transfer gate. Enabling the transfer gate to couple data to be written to the input node of the latch, also substantially disables the feedback device to effectively remove its affect upon the write operation.

In the preferred embodiment, the static latch of the present invention is implemented in CMOS transistor technology. Each single-bit cell of the latch includes two inverter circuits that are coupled in series circuit configuration forming an input node and an output node. A feedback device in the form of an MOS transistor having its source and drain leads respectively coupled to the input and output nodes, forming a communicating feedback path from the output to the input. Contrary to prior configurations (i.e., connection of the depletion device's gate lead to the output node to keep the device operating in the depletion mode at all times) the present invention couples the gate lead of the transistor forming the feedback device to the strobe line. The transfer gate is formed from a P-channel MOS transistor having its source lead connected to the input node, and the drain lead adapted to receive the data to be written to the latch. The gate lead of the transistor is coupled to the strobe line.

In operation, when the strobe signal is present, the MOS transistor forming the transfer gate is enabled, providing a communicating data path from its drain to the input node of the latch cell. At the same time, the strobe signal disables the communicating path from the output node to the input node formed by the feedback device transistor, substantially inhibiting the feedback transistor from supplying current to, or draining current from, the input node during the write process. Accordingly, the input node is charged or discharged primarily by the current path formed by the MOS transistor forming the transfer gate.

It will be evident to those skilled in this art that there are a number of advantages to be realized by the present invention. For example, since charging or discharging the input node need no longer take into consideration current supplied or drained by the feedback device, the MOS transistor of the transfer gate can be smaller in size, thereby reducing the semiconductor area required to form the latch. Also, use of a single strobe line, as opposed to the requirement of dual strobe lines when using parallel P-channel and N-channel MOS transistors for the transfer gate, obtain additional circuit area reduction.

A further advantage is that since the current contribution of the feedback device is essentially eliminated, the voltage at the input node can be charged to a higher level, to improve noise immunity and circuit speed.

These and other and further advantages will become evident to those skilled in the art upon reading of the following detail description, which should be taken in conjunction with the accompanying drawings.

BRIEF DESCRIPTION OF THE DRAWINGS

FIG. 1 is a diagrammatic representation of a multi-cell latch, and including a circuit diagram of the invention forming one cell of the latch; and FIG. 2 is an alternate embodiment of the invention.

DETAILED DESCRIPTION OF THE INVENTION

Referring first to FIG. 1, there is diagrammatically illustrated a static latch, designated generally with the letter L, comprising a number n of individual latch cells $L_1, L_2, \ldots, L_n$. Each of the latch cells $L_1$-$L_n$ are identical in circuit configuration and, accordingly, only the circuit configuration of the latch cell $L_1$ will be described.

As illustrated, the latch cell $L_1$ includes a pair of inverters 10 and 12 interconnected to form a series path between an input node 14 and an output node 16. An MOS transistor 18, configured to operate in the depletion mode, forms a feedback path between the output node 16 and the input node 14. The drain lead of the MOS transistor 18 is connected to the output node 16, and the source lead connected to the input node 14. A transfer gate, in the form of a P-channel MOS transistor 20, forms a data path that communicates a DATA IN signal to the input node 14 during a write operation. The MOS transistor 20 has its source lead connected to the input node 14, and the drain lead is operably connected to the system to receive the DATA IN signal.

As further illustrated in FIG. 1, the gate leads of the MOS transistors 18 and 20 are both coupled to the output of a NAND gate 22. NAND gate 22 provides a control signal in the form of a STROBE signal when there is coincidence between an ENABLE signal and a CLOCK signal $\phi$. The STROBE signal is conducted to the gate leads of both feedback transistor 18 and the transfer transistor 20 by strobe line 24.

In operation, data to be written to the latch cell $L_1$ is applied to the chain lead of the MOS transistor 20, and communicated to the input node 14 of the cell $L_1$ when the STROBE signal becomes a logic LOW. This places the MOS transistor 20 in a conducting state to communicate the DATA IN signal (which may a logic "0" or a logic "1") to the input node 14. At the same time, a logic LOW applied to the gate lead of the feedback transistor 18 substantially reduces current conduction thereof. In fact, if a logic "1" is stored in the cell $L_1$, conduction of the feedback transistor 18 will be essentially terminated during presence of the STROBE signal.

Thus, during presence of the STROBE signal, the state of the DATA IN signal will be "set" in the latch, when the STROBE signal disappears (by becoming a HIGH), the transfer transistor is disabled and the feedback transistor 18 is enabled, thereby latching the written information.

FIG. 2 illustrates an alternate embodiment of the invention, differing only in that the CMOS implementation utilizes a P-channel depletion device 118 to form the feedback path of the latch cell $L_1'$, and, accordingly, the transfer circuit is implemented by an N-channel enhancement transistor 120. The functionality and advantages of the present invention remain in this alternate embodiment, with perhaps the additional advantage that the N-channel transfer transistor 120 can be made smaller than the P-channel transfer transistor 20 (FIG. 1) because of the better BETA of N-channel devices, and the P-channel depletion device can be fabricated shorter in length and smaller physically.

To summarize the present invention, therefore, there has been disclosed a static latch implemented in CMOS integrated circuitry in a fashion that allows efficient use of a single device transfer gate. As indicated above, the advantages of this invention are that circuit operation is enhanced while the integrated circuit area needed to form the latch is reduced.

While the present invention has been disclosed in the form of a preferred embodiment utilizing CMOS circuitry, it will be apparent to those skilled in the art that the invention can take other forms. Accordingly, the foregoing description is meant to teach the best mode presently contemplated, the scope of the invention being circumscribed by the claims that accompany this description.

We claim:

1. A CMOS latch circuit operable to store a digital signal in response to a control signal, the latch comprising:
   a pair of CMOS inverter circuits coupled to one another in series circuit configuration and forming an input node and an output node; and
   feedback means comprising a depletion mode transistor having a drain lead coupled to the output node, a source lead coupled to the input node, and a gate lead coupled to receive the control signal thereby to communicate the output node to the input node in the absence of the control signal and to substantially terminate said communication when the control signal is present.

2. The latch of claim 1, and including transfer means for communicating the digital signal to the input node during the presence of the control signal.

3. The latch of claim 2, wherein the depletion MOS transistor is an N-channel MOS device and the transfer means includes a P-channel MOS transistor having a drain lead coupled to receive the digital signal, a source lead coupled to the input node, and a gate lead coupled to receive the enable signal.

4. In a CMOS circuit structured to form a plurality of one-bit storage elements, each storage element being of the type including a data input terminal and at least a pair of inverter circuits coupled to one another to form a series path, and a feedback device to couple an output node of the storage element to an inputs node of the storage element, the CMOS circuit being responsive to a control signal to receive and store a digital signal, the improvement comprising:
   feedback means including a depletion mode transistor coupling the output node to the input node for communicating the output terminal to the input terminal, including a control terminal operably coupled to receive the control signal and to substantially terminate said communication when the control signal is present, and to permit communication of the output node to the input node when the control signal is absent and an input transistor complementary to said depletion mode transistor coupled between said data input terminal and said input node, and having a control terminal operably coupled to receive the control signal whereby said data terminal is coupled to said storage element when said communication is terminated.

5. A CMOS digital latch for storing a digital signal in response to an control signal, comprising:

at least a pair of CMOS inverter circuits coupled to one another in series circuit configuration, and forming an input node for receiving the digital signal and an output node; and an MOS transistor, configured for operation in a depletion mode, coupling the output node to the input node, and having a gate lead coupled to receive the control signal, the MOS transistor being operable to communicate the output node to the input node in absence of the control signal, and to substantially terminate communication during presence of the control signal.

* * * * *